(12) United States Patent
Wu et al.

(10) Patent No.: US 12,249,518 B2
(45) Date of Patent: Mar. 11, 2025

(54) SEMICONDUCTOR DEVICE COMPRISING INTERCONNECT STRUCTURES

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/870,321

(22) Filed: Jul. 21, 2022

(65) Prior Publication Data

US 2022/0367211 A1    Nov. 17, 2022

Related U.S. Application Data

(62) Division of application No. 16/746,192, filed on Jan. 17, 2020, now Pat. No. 11,817,325.

(51) Int. Cl.
| | |
|---|---|
| *H01L 21/56* | (2006.01) |
| *H01L 21/52* | (2006.01) |
| *H01L 21/768* | (2006.01) |
| *H01L 23/31* | (2006.01) |
| *H01L 23/498* | (2006.01) |
| *H01L 23/522* | (2006.01) |

(52) U.S. Cl.
CPC .......... *H01L 21/52* (2013.01); *H01L 21/563* (2013.01); *H01L 21/76879* (2013.01); *H01L 23/3121* (2013.01); *H01L 23/49833* (2013.01); *H01L 23/5226* (2013.01)

(58) Field of Classification Search
CPC . H01L 21/563; H01L 23/5226; H01L 23/498; H01L 23/49833; H01L 23/49816
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

FOREIGN PATENT DOCUMENTS

| | | |
|---|---|---|
| CN | 103199055 B | 3/2016 |
| CN | 110660675 A | 1/2020 |

(Continued)

*Primary Examiner* — Phat X Cao
(74) *Attorney, Agent, or Firm* — Slater Matsil, LLP

(57) ABSTRACT

A system substrate package, a system package, and methods of forming the same are described herein. The system substrate package includes an integrated substrate with multiple discrete interconnect structures. In embodiments the multiple discrete interconnect structures are placed and encapsulated and have a gap formed between the multiple discrete interconnect structures. The system substrate package reduces package warpage and mitigates board level reliability issues.

19 Claims, 12 Drawing Sheets

(56) References Cited

U.S. PATENT DOCUMENTS

| | | |
|---|---|---|
| 9,735,131 B2 | 8/2017 | Su et al. |
| 10,630,296 B2 | 4/2020 | Lee et al. |
| 2013/0175694 A1 | 7/2013 | Shih et al. |
| 2013/0187258 A1* | 7/2013 | Lu ................... H01L 23/3135 257/621 |
| 2017/0213809 A1* | 7/2017 | Lu ........................ H01L 24/97 |
| 2017/0301650 A1* | 10/2017 | Yu ........................ H01L 24/82 |
| 2019/0238134 A1 | 8/2019 | Lee et al. |
| 2020/0006176 A1 | 1/2020 | Tsai et al. |
| 2020/0006241 A1 | 1/2020 | Wu et al. |
| 2020/0161242 A1* | 5/2020 | Lin ................... H01L 25/0652 |
| 2021/0035949 A1 | 2/2021 | Huang |
| 2021/0057352 A1 | 2/2021 | Agarwal et al. |
| 2021/0159188 A1 | 5/2021 | Fang et al. |

FOREIGN PATENT DOCUMENTS

| | | | | |
|---|---|---|---|---|
| DE | 102018102086 A1 * | 5/2019 | ......... | H01L 21/4853 |
| TW | 202002742 A | 1/2020 | | |

* cited by examiner

SEMICONDUCTOR DEVICE COMPRISING INTERCONNECT STRUCTURES

This application is a divisional of U.S. patent application Ser. No. 16/746,192, filed Jan. 17, 2020, entitled "Semiconductor Device and Methods of Manufacture," which is hereby incorporated as reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
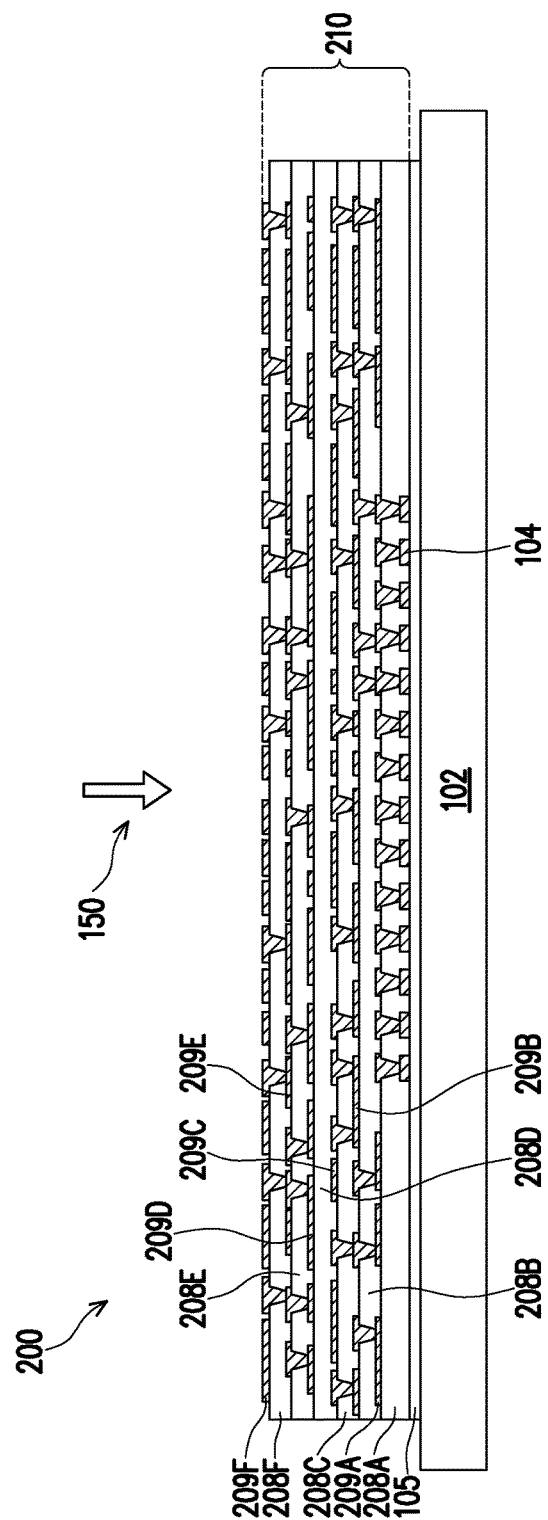
FIG. 1 illustrates a cross-sectional view of an intermediate step of forming a device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment which utilizes a system on integrated substrate (SoIS) with multiple substrates attached for increased package sizes. However, the ideas presented herein are not intended to be limited to the details recited below and may be used in a wide variety of applications. Each of these applications is fully intended to be included within the scope of the embodiments presented.

FIG. 1 illustrates a cross-sectional view of a redistribution structure 200 formed in an redistribution layer (RDL) build up process 150 in an intermediate step in forming a system package, in accordance with some embodiments. In particular, the RDL build up process 150 (designated by the directional arrow) includes forming the redistribution structure 200 on a carrier substrate 102, in accordance with some embodiments. The carrier substrate 102 comprises, for example, silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material or an organic material, and which may have a rectangular shape. The carrier substrate 102 may be planar in order to accommodate the formation of additional features subsequently formed thereon.

According to some embodiments, an adhesive layer (not shown) is formed on the carrier substrate 102 to facilitate a subsequent debonding of the carrier substrate 102. The adhesive layer may be formed of a polymer-based material, which may be removed along with the carrier substrate 102 from the overlying structures that will be formed in subsequent steps. In some embodiments, the adhesive layer is an epoxy-based thermal-release material, which loses its adhesive property when heated, such as a Light-to-Heat-Conversion (LTHC) release coating. In other embodiments, the adhesive layer may be an ultra-violet (UV) glue, which loses its adhesive property when exposed to UV light. However, other types of adhesives, such as pressure sensitive adhesives, radiation curable adhesives, epoxies, combinations of these, or the like, may also be used. The adhesive layer may be placed onto the carrier substrate 102 in a semi-liquid or gel form, which is readily deformable under pressure. According to some embodiments, the top surface of the adhesive layer may be leveled and may have a high degree of co-planarity.

According to some embodiments, a polymer layer 105 is placed over the adhesive layer and is utilized in order to provide protection to, e.g., the subsequently formed structures. In an embodiment the polymer layer 105 may be polybenzoxazole (PBO), although any suitable material, such as polyimide or a polyimide derivative, Solder Resistance (SR), or Ajinomoto build-up film (ABF) may be utilized. The polymer layer 105 may be placed using, e.g., a spin-coating process to a thickness of between about 2 μm and about 15 μm, such as about 5 μm, although any suitable method and thickness may be used.

Once the polymer layer 105 has been formed, contact pads 104 are formed over the polymer layer 105. In accordance with some embodiments, the contact pads 104 may be formed by initially forming a first seed layer (not shown) of one or more thin layers of a conductive material that aids in the formation of a thicker layer during subsequent processing steps. The first seed layer may comprise a layer of titanium created using processes such as sputtering, evaporation, or PECVD processes, depending upon the desired materials. A photoresist (also not shown) may then be formed and patterned to cover the first seed layer using, e.g., a spin coating technique. Once the photoresist has been formed and patterned, a conductive material may be formed on the first seed layer. The conductive material may be a material such as copper, titanium, tungsten, aluminum, another metal, the like, or a combination thereof. The conductive material may be formed through a deposition process such as electroplating or electroless plating, or the like. Once the conductive material has been formed, the photoresist may be removed through a suitable removal process such as ashing or chemical stripping. Additionally, after the removal of the photoresist, those portions of the first seed layer that were covered by the photoresist may be removed through, for example, a suitable wet etch process or dry etch process, which may use the conductive material as an etch mask. The remaining portions of the first seed layer and conductive material form the contact pads 104.

Once the contact pads 104 have been formed, a redistribution structure 210 is formed over the contact pads 104 and the carrier substrate 102, in accordance with some embodiments. The redistribution structure 210 shown includes insulating layers 208A-F (e.g., insulating layer 208A, insulating layer 208B, insulating layer 208C, insulating layer 208D, insulating layer 208E, and insulating layer 208F), and includes redistribution layers 209A-F (e.g., redistribution layer 209A, redistribution layer 209B, redistribution layer 209C, redistribution layer 209D, redistribution layer 209E, and redistribution layer 209F). Furthermore, the redistribution structure 210 may have any suitable number of insulating layers or redistribution layers.

Still referring to FIG. 1, the insulating layer 208A is formed over the contact pads 104 and the carrier substrate 102. The insulating layer 208A may be made of one or more suitable dielectric materials such as prepreg, resin coated copper (RCC), an oxide (e.g., silicon oxide), a nitride (e.g., silicon nitride), a photo image dielectric (PID), a polymer material such a PBO, a photosensitive polymer material, a molding material, a polyimide material, a low-k dielectric material, another dielectric material, the like, or a combination thereof. The insulating layer 208A may be formed by a process such as lamination, coating, (e.g., spin-coating), CVD, the like, or a combination thereof. The insulating layer 208A may have a thickness of between about 5 μm and about 50 μm, such as about 15 μm, although any suitable thickness may be used.

Openings into the insulating layer 208A may be formed using a suitable photolithographic mask and etching process in order to expose the underlying contact pads 104. For example, a photoresist may be formed and patterned over the insulating layer 208A, and one or more etching processes (e.g., a wet etching process or a dry etching process) are utilized to remove portions of the insulating layer 208A. In other embodiments in which the insulating layer 208A is formed of a photosensitive polymer such as PBO, polyimide, BCB, or the like, the openings may be patterned directly using an exposure and development process.

The redistribution layer 209A may then be formed to provide additional routing. In an embodiment, the redistribution layer 209A may be formed using materials and processes similar to the contact pads 104. For example, a second seed layer (not shown) may be formed, a photoresist placed and patterned on top of the second seed layer in a desired pattern for the redistribution layer 209A, and conductive material (e.g., copper, titanium, or the like) may then be formed in the patterned openings of the photoresist using e.g., a plating process. The photoresist may then be removed and the second seed layer etched, forming redistribution layer 209A. In this manner, the redistribution layer 209A may form electrical connections to the contact pads 104.

Additional insulating layers 209B-F and redistribution layers 209B-F may then be formed over the redistribution layer 209A and insulating layer 208A to provide additional routing. The insulating layers 209B-F and redistribution layers 209B-F may be formed in alternating layers, and may be formed using processes and materials similar to those used for the insulating layer 208A or the redistribution layer 209A. For example, an insulating layer (e.g., insulating layer 208B) may be formed over a redistribution layer (e.g., redistribution layer 209A), and then openings made through the insulating layer to expose portions of the underlying redistribution layer using a suitable photolithographic mask and etching process. A third seed layer (not shown) may be formed over the insulating layer and conductive material formed on portions of the third seed layer, forming an overlying redistribution layer (e.g., redistribution layer 209B). These steps may be repeated to form the redistribution structure 210 having a suitable number and configuration of insulation layers and redistribution layers. The insulating layers 208B-F may be formed to each have a thickness of between about 5 μm and about 50 μm, such as about 15 μm. In some embodiments, the redistribution structure 210 is a fan-out structure. In other embodiments, the redistribution structure 210 may be formed in a different process than described herein.

In a particular embodiment the insulating layer 208E and insulating layer 208F may be formed differently from the underlying insulating layer 208A, insulating layer 208B, insulating layer 208C, and insulating layer 208D. For example, in an embodiment the insulating layer 208A, the insulating layer 208B, the insulating layer 208C, and the insulating layer 208D may be formed of a material such as PBO. However, the insulating layer 208E and the insulating layer 208F may be formed from a different material and/or a different thickness, such as by being formed of an Ajonomoto build up film or a prepreg material to a larger thickness. However, any combination of materials and thicknesses may be utilized.

Figure 2A:
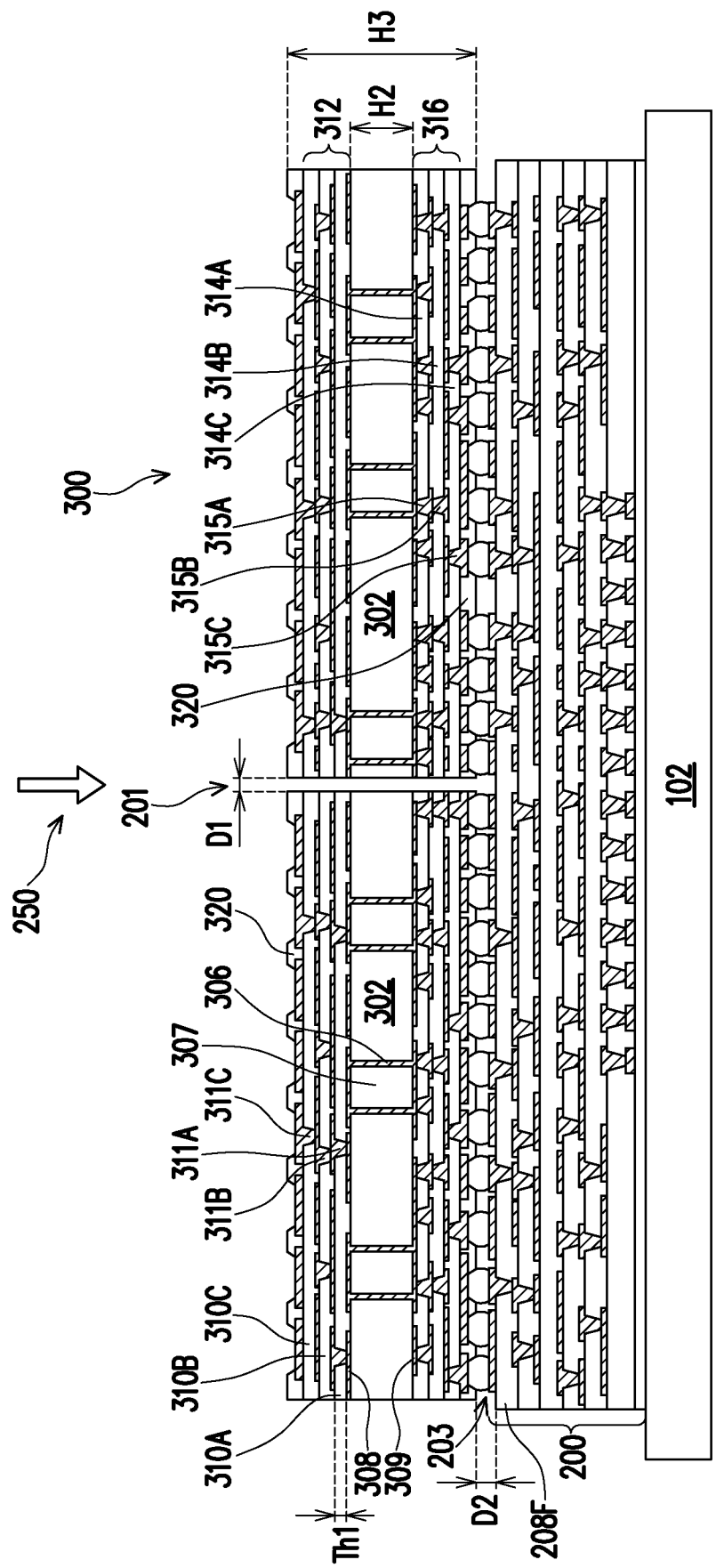
FIGS. 2A-2C illustrate a views of intermediate steps of forming an interconnect structure, in accordance with some embodiments.

Turning to FIG. 2A, this figure illustrates mounting an interconnect structure 300 over the redistribution structure 200, in accordance with some embodiments. In some embodiments, under-bump metallization structures (UBMs, not shown) are first formed on portions of the topmost redistribution layer of the redistribution structure 210 (e.g., redistribution layer 209F in FIG. 1). The UBMs may, for example, include three layers of conductive materials, such as a layer of titanium, a layer of copper, and a layer of nickel.

However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application. The UBMs may be created by forming each layer of the UBMs over the redistribution structure 210. The forming of each layer may be performed using a plating process, such as electroplating or electroless plating, although other processes of formation, such as sputtering, evaporation, or PECVD process, may be used depending upon the desired materials. Once the desired layers have been formed, portions of the layers may then be removed through a suitable photolithographic masking and etching process to leave the UBMs in a desired shape, such as a circular, octagonal, square, or rectangular shape, although any desired shape may alternatively be formed.

Still referring to FIG. 2A, external connectors 212 are formed over the redistribution structure 210. The external connectors 212 may be formed over the UBMs, if present. The external connectors 212 may be, for example, contact bumps or solder balls, although any suitable types of connectors may be utilized. In an embodiment in which the external connectors 212 are contact bumps, the external connectors 212 may include a material such as tin, or other suitable materials, such as silver, lead-free tin, or copper. In an embodiment in which the external connectors 212 are tin solder bumps, the external connectors 212 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 212. In some embodiments, the external connectors 212 may have a thickness between about 2 μm and about 500 μm. In some embodiments, the external connectors 212 may have a pitch between about 25 μm and about 1250 μm.

In some embodiments, the interconnect structure 300 may be, for example, an interposer or a "semi-finished substrate" which could either have active and passive devices or else may be free from active and passive devices. The interconnect structure 300 can also provide stability and rigidity to the attached redistribution structure 200, helping to reduce warping. In an embodiment the interconnect structure 300 comprises a core substrate 302 having conductive layers disposed on opposite surfaces. In some embodiments, the core substrate 302 may include a material such as a pre-impregnated composite fiber (prepreg) material, an epoxy, a molding compound, Ajinomoto build-up film (ABF), an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In other embodiments, the core substrate 302 may be a double-sided copper-clad laminate (CCL) substrate or the like. The core substrate 302 may have a second height H2 of between about 30 μm and about 2000 μm, such as about 250 μm or about 500 μm. However, any suitable height may be used.

Referring to FIG. 2A, openings are formed in the core substrate 302 within which through vias 306 are formed (described below). In some embodiments, the openings are formed by, for example, a laser drilling technique. Other processes, e.g., mechanical drilling, etching, or the like, may also be used in other embodiments.

Once the openings have been formed, conductive material is deposited to form the routing layer 308 on a side of the core substrate 302 and through vias 306 within the openings in the core substrate 302. In some embodiments, the routing layer 308 and through vias 306 are formed from a conductive material such as copper, aluminum, or combinations of these, or the like, using a deposition process such as photoresist patterning and plating; blanket chemical vapor deposition, atomic layer deposition, physical vapor deposition, combinations of these or the like. The deposition process lines or fills the openings to form the through vias 306, as well as forming the routing layer 308. Once the conductive material has been deposited, the conductive material may be patterned (in embodiments in which a blanket deposition was performed) or else the patterned photoresist may be removed (in embodiments in which a plating process is utilized). However, any suitable deposition and/or patterning process may be utilized.

Once the routing layer 308 has been formed, a similar process may then be performed on the opposite side of the core substrate 302 to form the routing layer 309 (and/or remaining portions of through vias 306) on the opposite side of the core substrate 302. In this manner, the conductive material may be used to form the routing layer 308 and the routing layer 309 on opposite sides of the core substrate 302 and through vias 306 extending through the core substrate 302.

Optionally, in some embodiments in which the deposition of the conductive material does not fully fill the openings, a remainder of the openings may then be filled with a dielectric material 307. The dielectric material 307 may provide structural support and protection for the conductive material formed along the sidewalls. In some embodiments, the dielectric material 307 may be a material such as a molding material, epoxy, an epoxy molding compound, a resin, the like, or a combination thereof. The dielectric material 307 may be formed or placed using, e.g., a molding process, a spin-on process or another process.

Continuing with FIG. 2A, dielectric layers and additional routing layers may be formed over the routing layers 308 and 309 to form routing structures 312 and 316. The routing structures 312 and 316 are formed on opposite sides of the core substrate 302 and may provide additional electrical routing within the interconnect structure 300. The routing structure 312 is electrically connected to the routing layer 308 and includes alternating dielectric layers 310A-C and routing layers 311A-C. The routing structure 316 is electrically connected to the routing layer 309 and includes alternating dielectric layers 314A-C and routing layers 315A-C. Each of the routing structures 312 or 316 may have any suitable number of dielectric layers or routing layers, including more or fewer than shown in FIG. 2A. In some embodiments, one or both of routing structures 312 or 316 may be omitted. In some embodiments, the number of layers of routing structure 312 may be different than the number of layers of routing structure 316.

In some embodiments, the routing structure 312 is formed by forming the dielectric layer 310A over the routing layer 308 and the core substrate 302. In some embodiments, the dielectric layer 310A may be a material such as a build-up material, ABF, a prepreg material, a laminate material, another material similar to those described above for the core substrate 302, the like, or combinations thereof. The dielectric layer 310A may be formed by a lamination process, a coating process, or another suitable process. In some embodiments, the dielectric layer 310A may have a first thickness Th1 of between about 5 μm and about 50 μm.

Openings are formed in the dielectric layer 310A that expose portions of the routing layer 308 for subsequent electrical connection. In some embodiments, the openings are formed by, for example, an etching process, a laser drilling technique, or the like. Other processes, e.g., mechanical drilling or the like, may also be used in other embodiments. In some embodiments, an optional surface preparation process (e.g., a desmear process or the like) may be performed after the openings are formed.

A conductive material is then deposited to form routing layer 311A on the dielectric layer 310A and within the openings in the dielectric layer 310A. In some embodiments, the routing layer 311A is formed by first forming a seed layer and a patterned mask over the dielectric layer 310A. The patterned mask may be, for example, a patterned photoresist layer. Openings in the patterned mask may expose portions of the seed layer on which conductive material will subsequently be formed. The conductive material may then be deposited on the exposed regions of the dielectric layer 310A and within the openings in the dielectric layer 310A using, for example, a plating process, an electroless plating process, or another process. In some embodiments, the conductive material is deposited having a thickness of between about 1 µm and about 50 µm. After depositing the conductive material, the patterned mask layer (e.g., the photoresist) may be removed using a wet chemical process or a dry process (e.g., an ashing process). In this manner, an additional routing layer (e.g., routing layer 311A) is formed over and electrically connected to the routing layer 308.

Additional dielectric layers 310B-C and routing layers 311B-C may then be formed adjacent to the routing layer 311A and dielectric layer 310A to provide additional routing along with electrical connection within the routing structure 312. The dielectric layers 310B-C and routing layers 311B-C may be formed in alternating layers, and may be formed using processes and materials similar to those used for the dielectric layer 310A or the routing layer 311A. These steps may be repeated to form a routing structure 312 having any suitable number and configuration of dielectric layers and routing layers.

In some embodiments, dielectric layers 314A-C and routing layers 315A-C may be formed adjacent to the routing layer 309 to form the routing structure 316. The routing structure 316 may be formed using a process similar to that of the routing structure 312, described above. However, any suitable process may be utilized.

In some embodiments, a protection layer 320 is formed over the routing structures 312 and 316 of interconnect structures 300. The protection layer 320 may be e.g., a solder resist material or a PBO material, and may be formed to protect the surfaces of the routing structures 312 or 316. In some embodiments, the protection layer 320 may be a photosensitive material formed by printing, lamination, spin-coating, or the like. The photosensitive material may then be exposed to an optical pattern and developed, forming openings in the photosensitive material. In other embodiments, the protection layer 320 may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protection layer 320 may be formed and patterned over the routing structure 312 and the routing structure 316 using the same techniques. Other processes and materials may also be used.

The interconnect structures 300 may be formed with one or both of the routing structures 312 and 316. The interconnect structure 300 may be formed with the protection layer 320 formed and patterned over one or both of the routing structures 312 and 316. As such, the interconnect structures 300 may be formed to a third height H3 of between about 200 µm and about 3,000 µm, such as about 1,500 µm, according to some embodiments. However any suitable height may be used.

FIG. 2A further illustrates a mounting process 250 (designated by the directional arrow), such as a substrate mounting process, including placement of a plurality of the interconnect structures 300 into electrical connection with the redistribution structure 200, in accordance with some embodiments. In an embodiment, the interconnect structures 300 are placed into physical contact with the external connectors 212 on the redistribution structure 200 using, e.g., a pick and place process. The interconnect structures 300 may be placed such that exposed regions of a topmost routing layer are aligned with corresponding connectors of the external connectors 212 on the redistribution structure 200. Once in physical contact, a reflow process may be utilized to bond the external connectors 212 of the redistribution structure 200 to the interconnect structures 300. In some embodiments, external connectors are formed on the interconnect structures 300 instead of or in addition to the external connectors 212 formed on the redistribution structure 200.

In the embodiment shown in FIG. 2A, the interconnect structures 300 may be placed such that a first gap 201 is present between them. In some embodiments, the spacing of adjacent redistribution structures may be controlled such that the first gap 201 is a certain distance or within a certain range of distances. For example, the first gap 201 may be a first distance D1 of between about 40 µm and about 5000 µm. However, any suitable distance may be used. In some cases, the first gap 201 distance may be controlled in order to avoid collision between the interconnect structures 300 during placement. Furthermore, a second gap 203 is formed between the protection layer 320 of the interconnect structure 300 and the top insulating layer of the redistribution structure 200. According to some embodiments, the second gap 203 has a second distance D2 of between about 10 µm and about 300 µm. However, any suitable distance may be used. According to some embodiments, the distance of the first gap 201 and the distance of the second gap 203 may be controlled to accommodate a subsequent deposition of a molding compound (e.g., dispense molding underfill (DMUF)), as discussed in greater detail below.

Figure 2B:
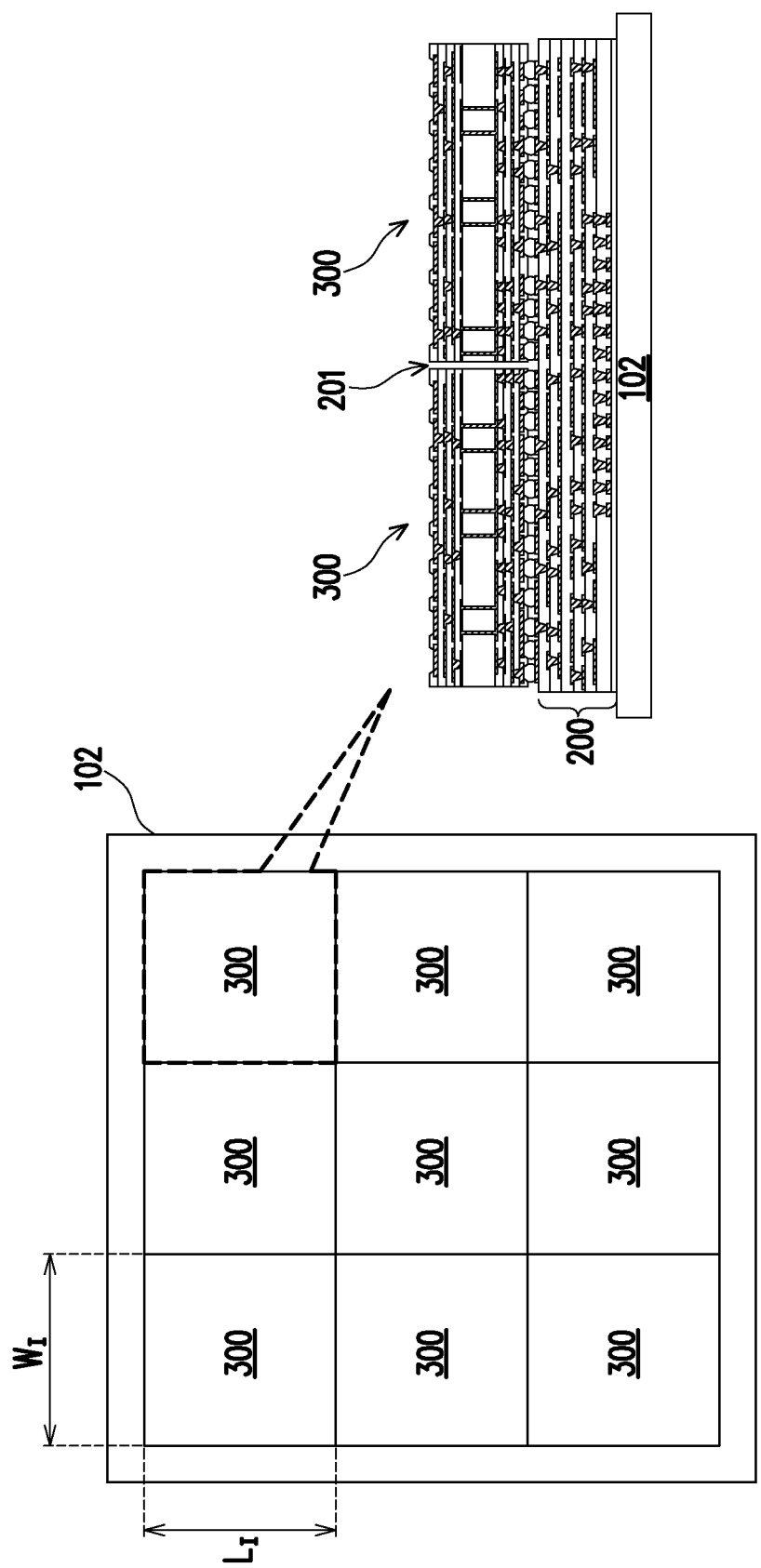

FIG. 2B illustrates a top-down view of an intermediate structure after mounting of the interconnect structures 300 using a panel process, in accordance with some embodiments. As illustrated in FIG. 2B, the interconnect structures 300 may have rectangular shapes and may be formed using the carrier substrate 102 having a rectangular shape, and the carrier substrate 102 may be referred to as a panel. Any of the processes and procedures suitable for placing the interconnect structures 300 on the carrier substrate 102 (e.g., wafer) having the round shape panel may be used to place the interconnect structures 300 using the carrier substrate 102 (e.g., panel) having the rectangular shape. Although nine of the interconnect structures 300 are illustrated in FIG. 2B, any number of interconnect structures 300 may be formed on the panel carrier substrate.

Each of the interconnect structures 300 may similarly sized and shaped, although in other embodiments the separate interconnect structures 300 may be different sizes and shapes. In a particular embodiment each of the interconnect structures 300 may have an interconnect width WI of between about 40 mm and about 210 mm, such as about 90.6 mm, while each of the interconnect structures 300 may have an interconnect length Li of between about 40 mm and about 210 mm, such as about 90.6 mm. However, any suitable length and width may be utilized.

Figure 2C:
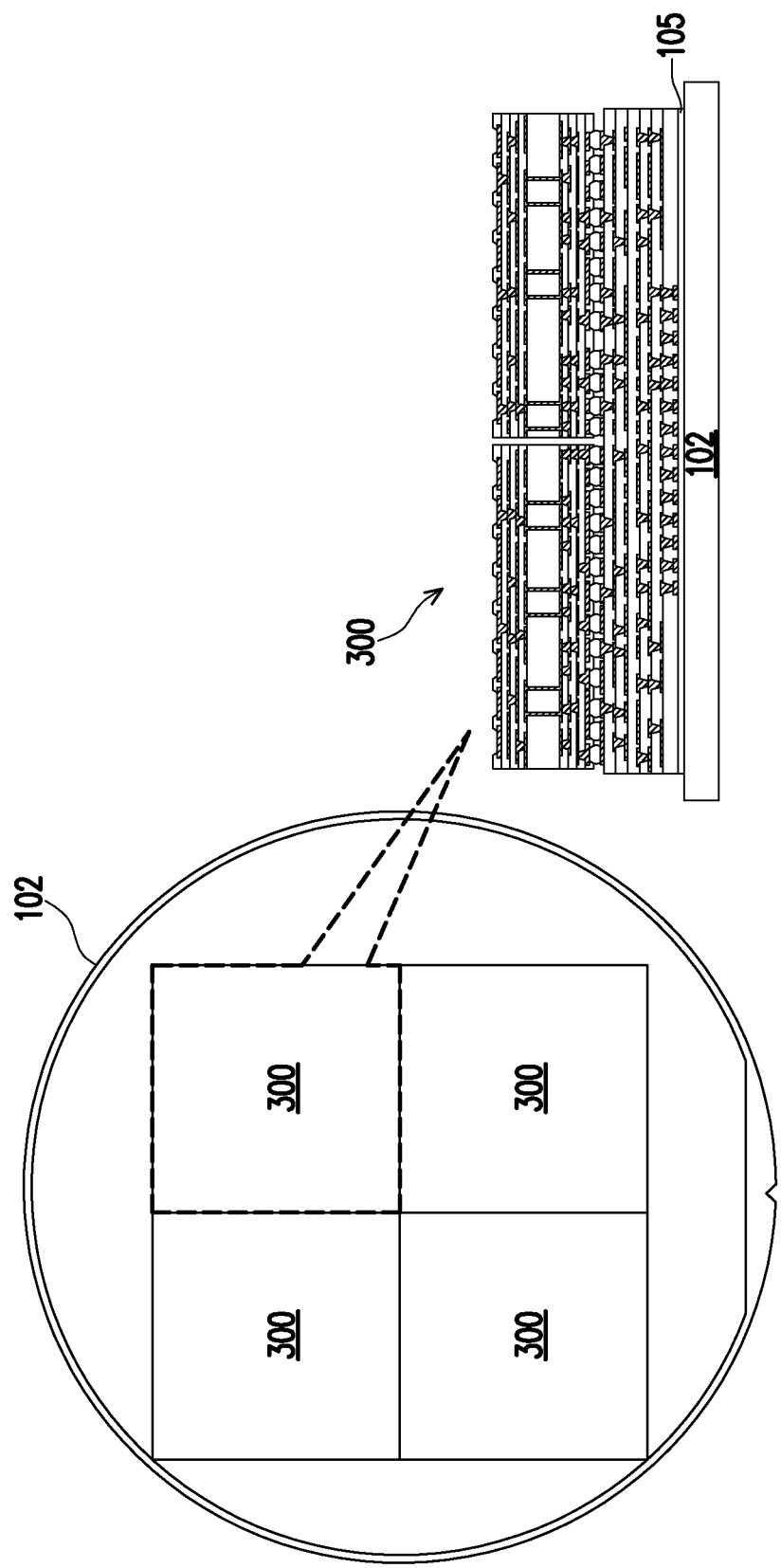

FIG. 2C illustrates a top-down view of an intermediate structure after the mounting of the interconnect structures 300 using a wafer form process instead of a panel form process (as described above with respect to FIG. 2B), in accordance with other embodiments. As illustrated in FIG. 2C, a plurality of the interconnect structures 300 having rectangular shapes are placed on a single wafer carrier substrate having a round shape, such as a circular shape. The carrier substrate 102 having the round shape, may be referred to herein as a wafer carrier substrate. Although four of the package substrates 400 are illustrated in FIG. 2C, any number of the interconnect structures 300 may be formed on the wafer carrier substrate, such as from a single package substrate to thousands of package substrates. Any suitable number may be utilized.

Figure 3A:
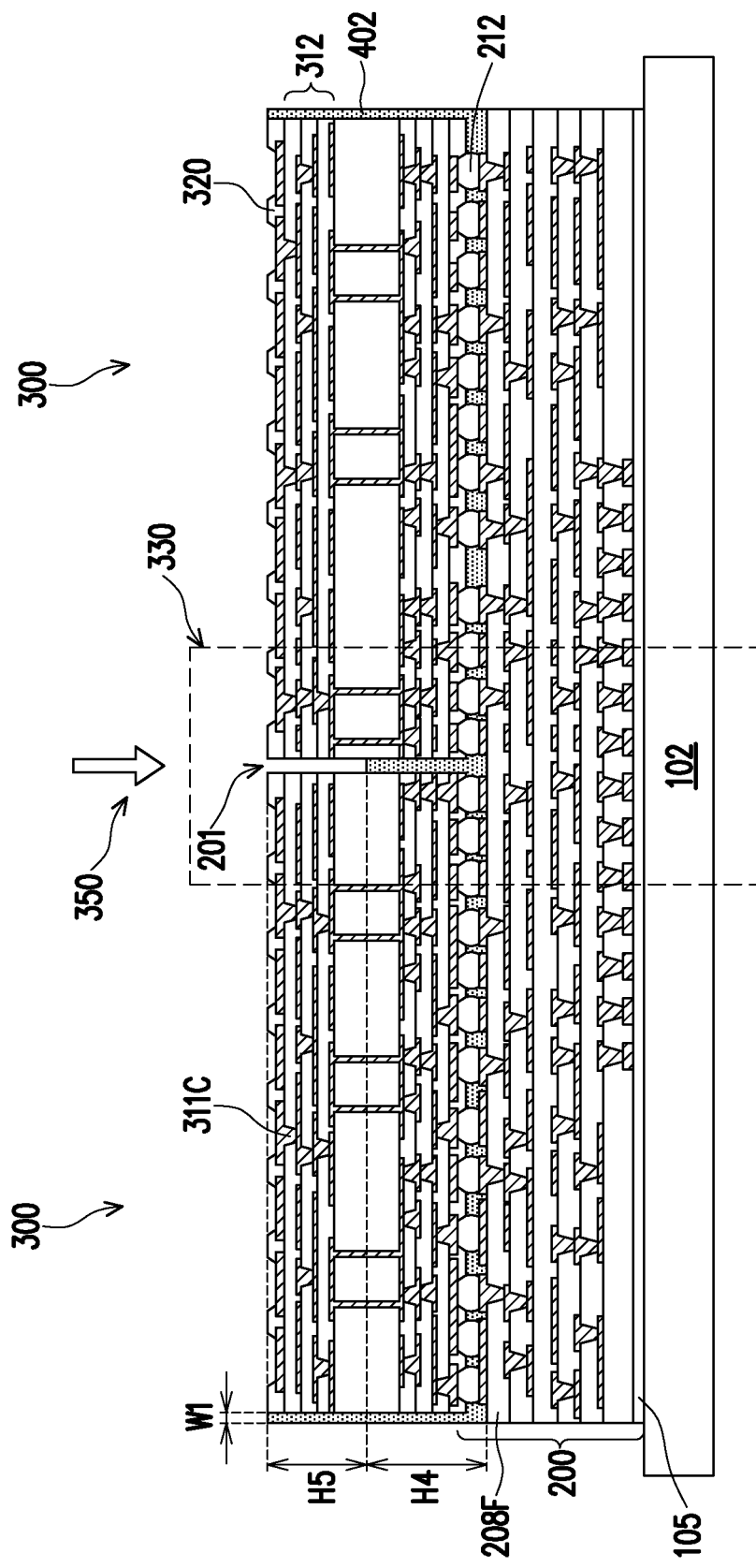
FIGS. 3A-5B illustrate cross-sectional views of intermediate steps of forming a package, in accordance with some embodiments.

FIG. 3A illustrates a molding process 350 (designated by the directional arrow) for encapsulating the interconnect structures 300 attached to the redistribution structure 200, in accordance with some embodiments. As shown in the highlighted section 330, the underfill 402 is deposited to fill the voids in between external connectors 212 within the second gap 203 and to encapsulate the interconnect structures 300 within the underfill 402, wherein the underfill 402 at least partially fills the first gap 201 between the interconnect structures 300. According to some embodiments, the underfill 402 is placed to fill the voids within the second gap 203 in between external connectors 212 connecting the redistribution structure 200 and the interconnect structures 300 and forms along sidewalls of the interconnect structures 300 to a first width W1 to align with an outer perimeter of the redistribution structure 200. According to some embodiments, the underfill 402 is formed to the first width W1 of between about 40 μm and about 5,000 μm, such as about 200 μm. However, any suitable width and any suitable thickness may be used for the first width W1 of the underfill 402.

Figure 3B:
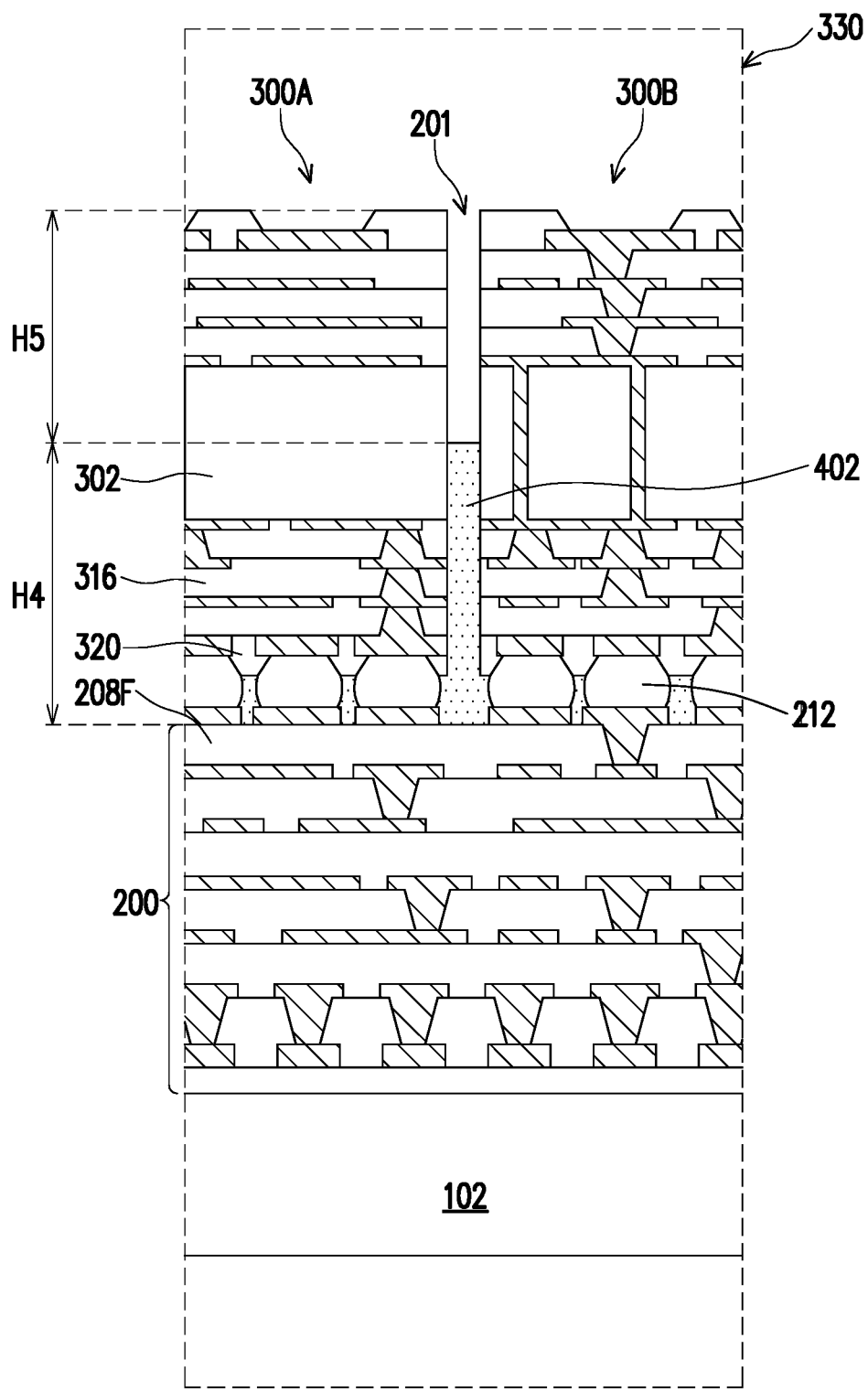

FIG. 3B illustrates a magnified view of the highlighted section 330 in FIG. 3A, in accordance with some embodiments. As can be seen, in some embodiments the underfill 402 is deposited to partially fill in the first gap 201 from the top insulating layer (e.g., 208F) of the redistribution structure 200 to a fourth height H4 at a point between sidewalls of the interconnect structures 300. In some embodiments, the underfill 402 partially fills the first gap 201 to the fourth height H4 of between about 500 μm and about 1,700 μm, such as about 1,600 μm. However, any suitable thickness may be used for the fourth height H4.

A remaining portion of the first gap 201 forms a void within the first gap 201 from the underfill 402 to a top of the protection layer 320. According to some embodiments, the void within the first gap 201 has a fifth height H5 of between about 0 μm and about 1,200 μm, such as about 100 μm. According to some embodiments, the underfill 402 is formed such that a ratio of the fifth height H5 of the void in the first gap 201 to the fourth height H4 of the underfill 402 in the first gap 201 is between about 0.1:1 and about 4:1, such as about 0.2:1.

Depending on the fourth height H4 of the underfill 402 within the first gap 201, the underfill 402 forms a first interface extending along one or more sections of a first sidewall of a first interconnect structure 300A facing the first gap 201 and forms a second interface extending along one or more sections of a second sidewall of a second interconnect structure 300B facing the first gap 201. According to some embodiments, the first sidewall interface extends along a first section of the first sidewall comprising the protection layer 320 of the first interconnect structure 300A and the second sidewall interface extends along a first section of the second sidewall comprising the protection layer 320 of the second interconnect structure 300B. In some embodiments, the first sidewall interface extends along the first section and a second section of the first sidewall, the second section of the first sidewall comprising the routing structure 316 of the first interconnect structure 300A and the second sidewall interface extends along the first section and a second section of the second sidewall, the second section of the second sidewall comprising the routing structure 316 of the second interconnect structure 300B. In some embodiments, the first sidewall interface extends along the first and second sections and a third section of the first sidewall, the third section of the first sidewall comprising the core substrate 302 of the first interconnect structure 300A and the second sidewall interface extends along the first and second sections and a third section of the second sidewall, the third section of the second sidewall comprising the core substrate 302 of the second interconnect structure 300B.

According to some embodiments, the underfill 402 may be a material such as a molding compound, an epoxy, an underfill, a dispense molding underfill (DMUF), a resin, or the like. The underfill 402 may be dispensed using, e.g., a molding process, such as a transfer molding process, an injection process, combinations of these, or the like. The underfill 402 can protect the external connectors 212 and can provide structural support for the redistribution structure 200. In some embodiments, the underfill 402 may be cured after placement.

Figure 4:
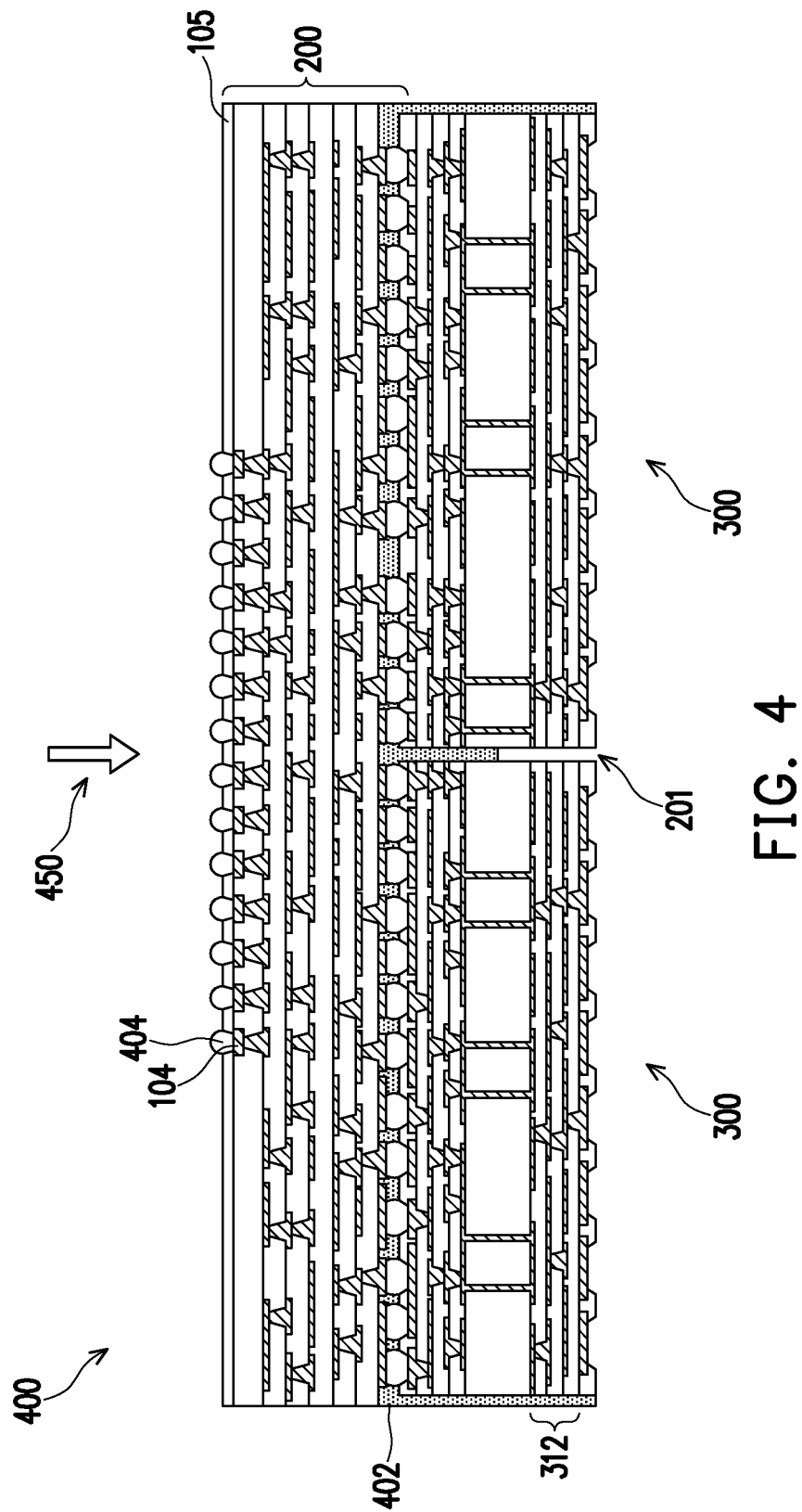

FIG. 4 illustrates the formation of a package substrate 400 (e.g., integrated substrate (IS)), in accordance with some embodiments. In particular, FIG. 4 illustrates a debonding process 450 (designated by the directional arrow) of the carrier substrate 102 and formation of conductive connectors 404 on the contact pads 104 for the package substrate 400. The carrier substrate 102 may be debonded from the redistribution structure 200 using, e.g., a thermal process to alter the adhesive properties of the adhesive layer (not shown) disposed on the carrier substrate 102. In a particular embodiment an energy source such as an ultraviolet (UV) laser, a carbon dioxide ($CO_2$) laser, or an infrared (IR) laser, is utilized to irradiate and heat the adhesive layer until the adhesive layer loses at least some of its adhesive properties. Once performed, the carrier substrate 102 and the adhesive layer may be physically separated and removed from the redistribution structure 200. Once the carrier substrate 102 and the adhesive layer have been removed, the resulting structure may be flipped over, and the interconnect structures 300 may be attached to a temporary substrate (not shown), such as a tape, wafer, panel, frame, ring, or the like for further processing.

FIG. 4 additionally illustrates a patterning of the polymer layer 105 in order to expose the contact pads 104. In an embodiment the polymer layer 105 may be patterned using, e.g., a laser drilling method. In such a method a protective layer, such as a light-to-heat conversion (LTHC) layer or a hogomax layer (not separately illustrated in FIG. 4) is first deposited over the polymer layer 105. Once protected, a laser is directed towards those portions of the polymer layer 105 which are desired to be removed in order to expose the underlying contact pads 104.

In another embodiment, the polymer layer 105 may be patterned by initially applying a photoresist (not individually illustrated in FIG. 4) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Once the contact pads 104 have been exposed, the conductive connectors 404 may be formed over the contact pads 104 making electrical connection to the redistribution structure 200. In some embodiments, an optional solderability treatment (e.g., pre-soldering treatment) may be performed on the exposed surfaces of the contact pads 104 prior to forming the conductive connectors 404. The conductive connectors 404 may be, for example, contact bumps or solder balls (e.g., C4 balls, ball grid array (BGA)), although any suitable type of connectors may be utilized. In an embodiment in which the conductive connectors 404 are contact bumps, the conductive connectors 404 may include a material such as tin, or other suitable materials, such as silver, lead-free tin, or copper. In an embodiment in which the conductive connectors 404 are tin solder bumps, the conductive connectors 404 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the conductive connectors 404. In some embodiments, the conductive connectors 404 may be similar to external connectors 212 described above.

Figure 5A:
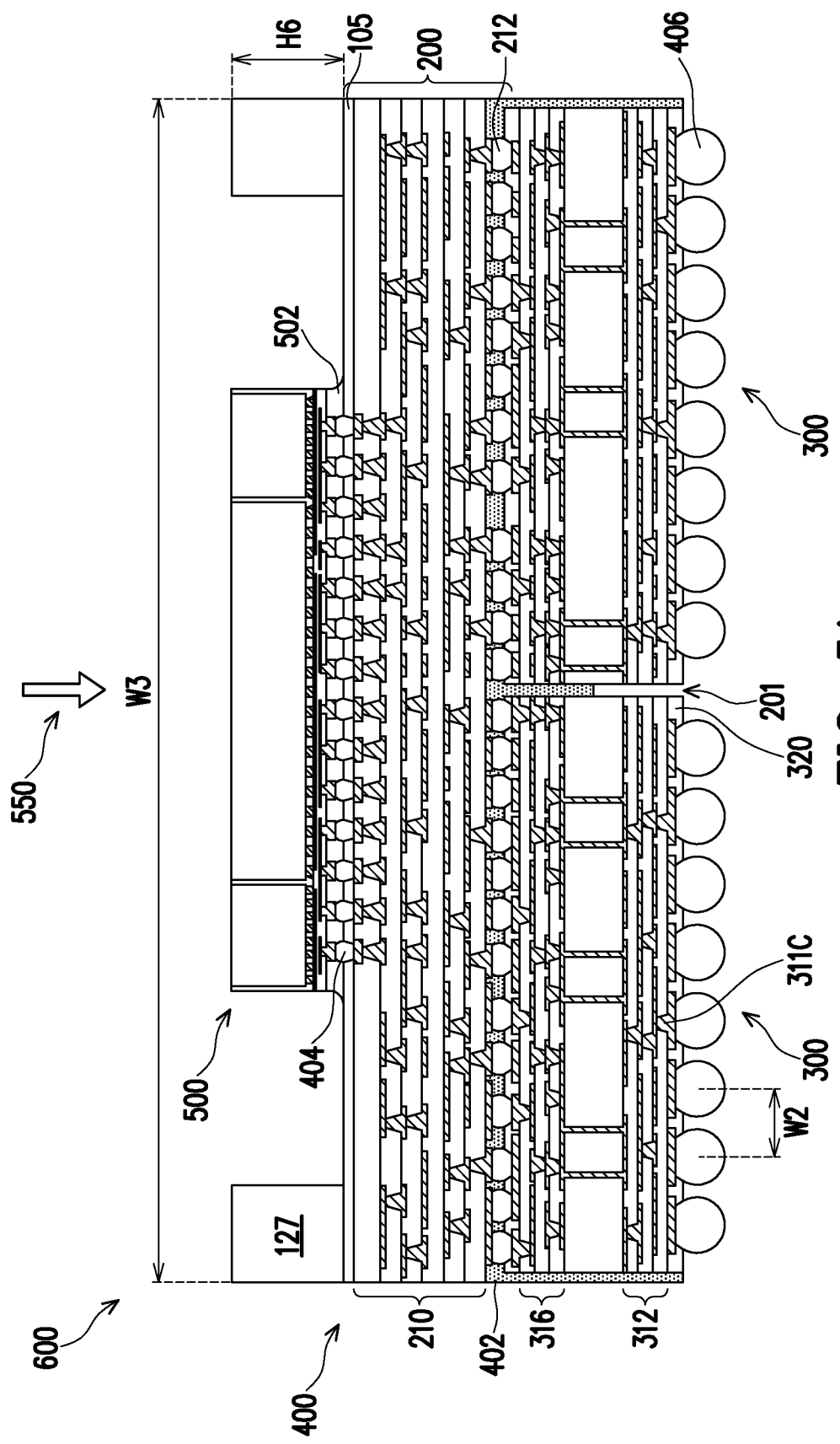

FIG. 5A illustrates a placement process 550 (designated by the directional arrow) for the formation of a system package 600 (e.g., system on integrated substrate (SoIS)), in accordance with some embodiments. A packaged semiconductor device 500 is placed on the conductive connectors 404 of the redistribution structure 210, making electrical connection between the packaged semiconductor device 500 and the redistribution structure 210 of the package substrate 400. The packaged semiconductor device 500 may be placed on the conductive connectors 404 using a placement process 550 such as a pick-and-place process. The packaged semiconductor device 500 may include one or more devices, which may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In an embodiment, the packaged semiconductor device 500 includes integrated circuit devices, such as transistors, capacitors, inductors, resistors, metallization layers, external connectors, and the like, therein, as desired for a particular functionality. In some embodiments, the packaged semiconductor device 500 may include more than one of the same type of device, or may include different devices. FIG. 5A shows three semiconductor devices encapsulated and connected with redistribution structures and contact pads, but in other embodiments one, two, or more than three semiconductor devices may be attached to the conductive connectors 404.

The packaged semiconductor device 500 may be placed such that the contact pads are aligned with the conductive connectors 404 of the package substrate 400. Once in physical contact, a reflow process may be utilized to bond the conductive connectors 404 of the redistribution structure 200 to the packaged semiconductor device 500. In some embodiments, external connectors are formed on the packaged semiconductor device 500 instead of or in addition to the conductive connectors 404 formed on the redistribution structure 200. In some embodiments, the conductive connectors 404 are not formed on the redistribution structure 200, and the packaged semiconductor device 500 is bonded to the redistribution structure 200 using a direct bonding technique such as thermocompression bonding, hybrid bonding, metal-to-metal bonding, or the like. However, any suitable bonding technique may be utilized.

As shown in FIG. 5A, in embodiments which utilize the conductive connectors 404, once the package semiconductor device 500 has been bonded an underfill 502 may be deposited along the sidewalls of the gap between the packaged semiconductor device 500 and the redistribution structure 200. The underfill 502 may also at least partially surround some conductive connectors 404. The underfill 502 may be a material such as a molding compound, an epoxy, an underfill, a molding underfill (MUF), a resin, or the like, and may be similar to underfill 402 described previously.

FIG. 5A also illustrates that a ring structure 127 is attached to the redistribution structure 200 surrounding the packaged semiconductor device 500, in accordance with some embodiments. The ring structure 127 may be attached to protect the packaged semiconductor device 500, to add stability to the package substrate 400, and/or to dissipate heat from the packaged semiconductor device 500 and the package substrate 400. The ring structure 127 may be formed from a material having a high thermal conductivity, such as steel, stainless steel, copper, aluminum, combinations thereof, or the like. In some embodiments, the ring structure 127 may be a metal coated with another metal, such as gold. According to some embodiments, the ring structure 127 comprises materials suitable for providing a thermal path from the redistribution structure 200 to an overlying heat extraction device (not shown) for transferring heat away from the packaged semiconductor device 500. Heat extraction devices include, but are not limited to, devices such as vapor chamber lids, heatsinks, and the like. In other embodiments, the ring structure 127 may not be thermally coupled to an overlying heat extraction device and may provide a distributed heat transfer from the redistribution structure 200 to the environment. An adhesive (not shown), for example, a thermal interface material (TIM) adhesive may be used to secure the ring structure 127 to the redistribution structure 200. Thus, the ring structure 127 and the thermal interface material (TIM) may provide increased effectiveness and efficiency of heat transfer away from the redistribution structure 200.

According to some embodiments, the ring structure 127 is formed to a third width W3 to match a width of the package substrate 400 and is formed to a sixth height H6 to match a height of the packaged semiconductor device 500 over the package substrate 400. In some embodiments, the third width W3 is between about 10 mm and about 500 mm, such as about 30 mm or, for example, about 12 mm and the sixth height H6 is between about 50 µm and about 5,000 µm, such as about 2,000 µm. However, any suitable widths and heights may be used for the ring structure 127. For example, if the package substrate 400 has a width of about 12 mm, a ring structure 127 having a third width W3 of about 12 mm and a sixth height H6 of about 2,000 μm may be applied to the package substrate 400 to appropriately control the package warpage to within 250 μm.

FIG. 5A further illustrates external connectors 406 that are formed over and electrically connected to the interconnect structures 300. The external connectors 406 may be formed as any suitable connector (e.g., BGAs, C4 balls, contact bumps, solder balls, or the like) using any suitable process for forming the external connectors 212 or the conductive connectors 404, as set forth above. However, any suitable connectors and any suitable process may also be utilized. The external connectors 406 (e.g., ball grid array (BGA)) may be formed via a suitable BGA ball mount process on exposed portions of the outermost routing layer of the routing structure 312. In some embodiments, the external connectors 406 may have a thickness between about 2 μm and about 1000 μm. In some embodiments, the external connectors 406 may have a pitch W2 of between about 100 μm and about 1,500 μm.

Figure 5B:
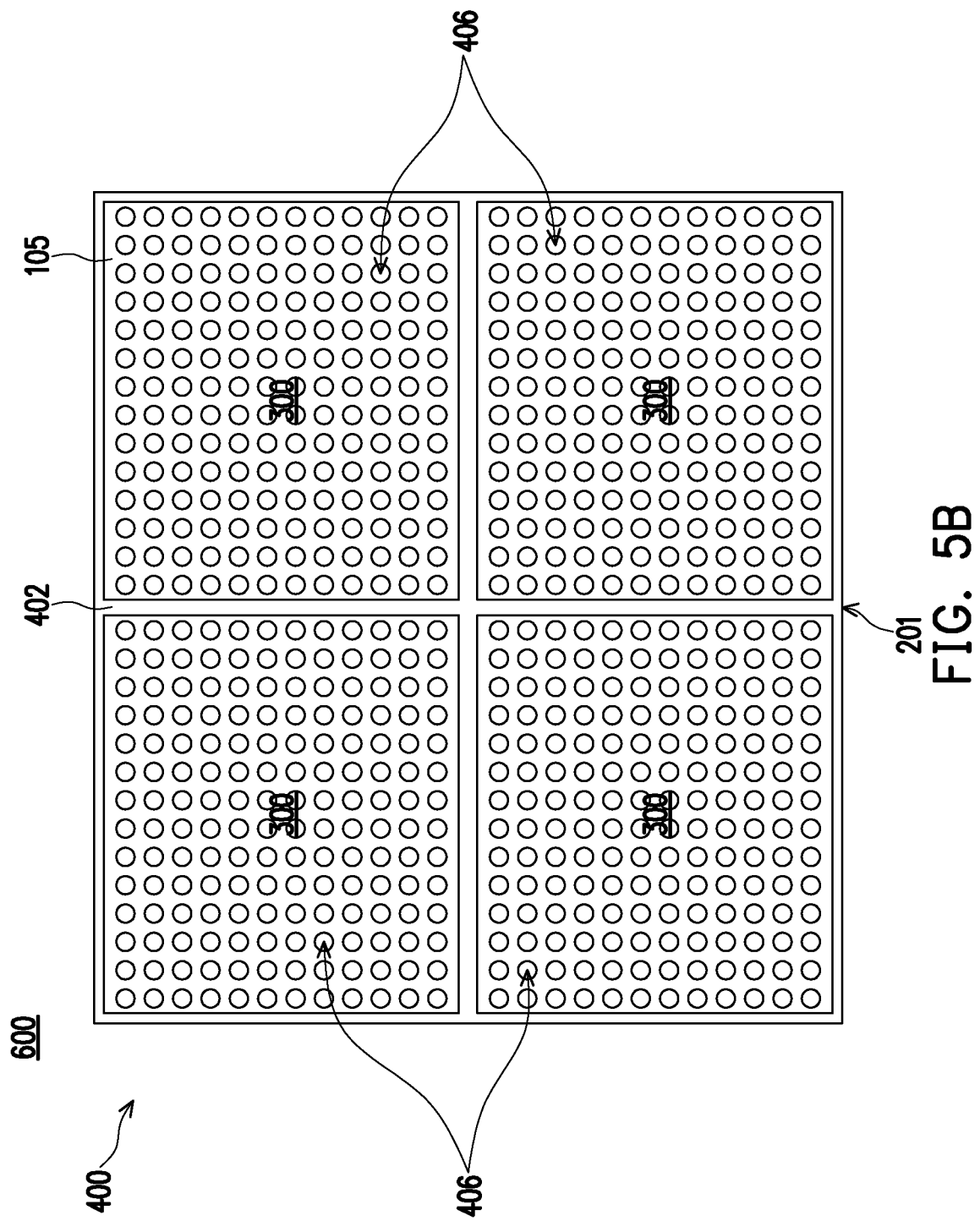

FIG. 5B illustrates a bottom view of the system package 600 (e.g., SoIS), in accordance with some embodiments. In the bottom view, the package substrate 400 (e.g., integrated substrate (IS)) is illustrated as a grouping of four of the interconnect structures 300 embedded in the underfill 402 separated by the first gap 201. In the bottom view of FIG. 5B, the external connectors 406 are illustrated as a ball grid array (BGA) configuration formed over the protection layer 320 of each of the interconnect structures 300. Although the package substrate 400 is illustrated as a group of four (e.g., 2×2) interconnect structures 300, the package substrate 400 may comprise a group of any suitable number (e.g., 2×2, 3×2, 4×3, 4×4, etc.) of discrete substrates embedded in the underfill 402 and may be separated by any suitable gap distance. Furthermore, the external connectors 406 of the interconnect structures 300 may comprise any suitable number of connectors and may be arranged in any suitable configuration.

Figure 6:
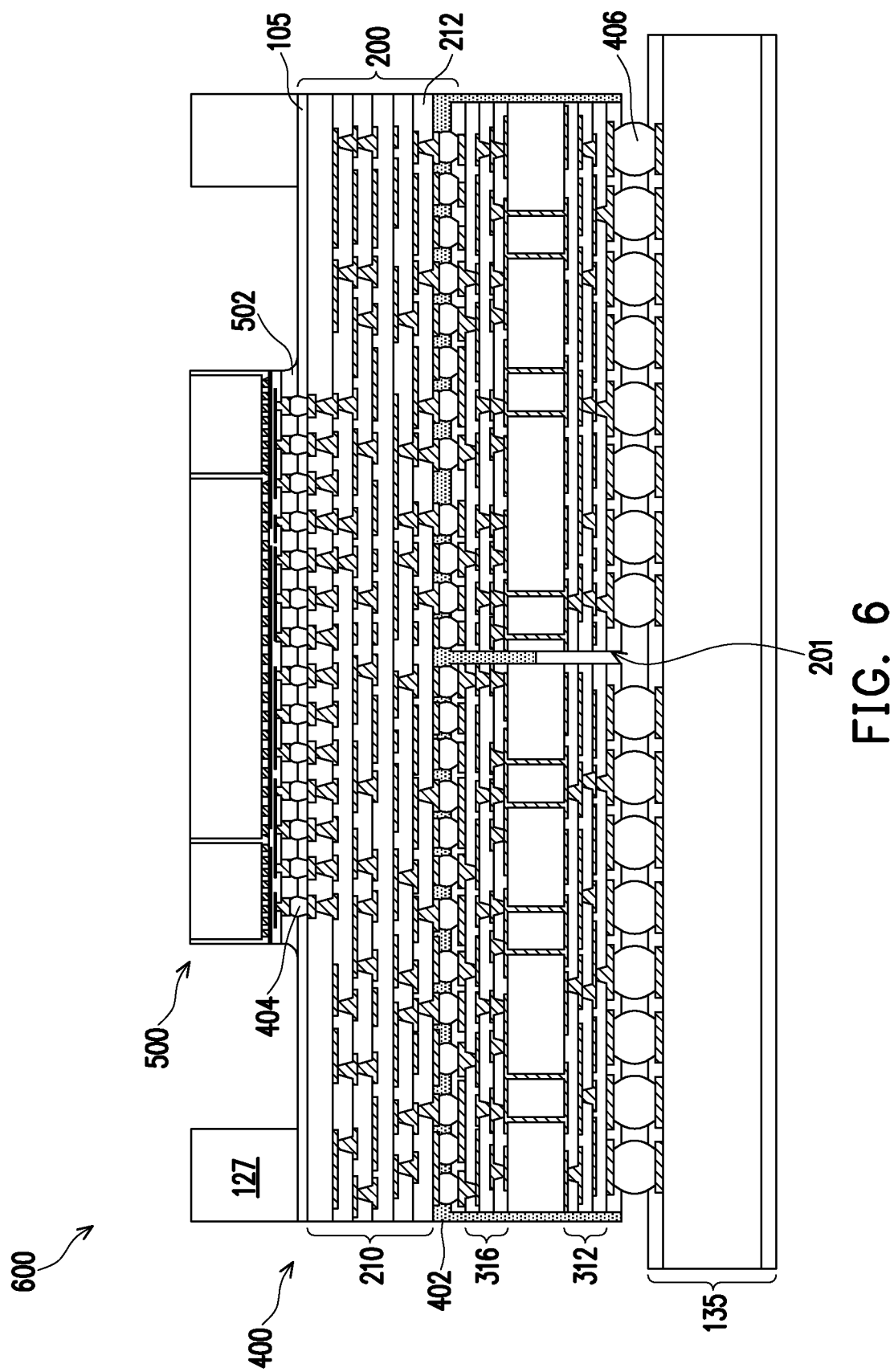
FIG. 6 illustrates a cross-sectional view of an intermediate step of attaching the package of FIG. 5A to a printed circuit board (PCB), in accordance with some embodiments.

FIG. 6 illustrates a cross-sectional view of intermediate steps in mounting the system package 600 to a support substrate 135 (e.g., printed circuit board (PCB)). In an embodiment the support substrate 135 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized, and all such redistributive substrates that provide support and connectivity to the structure including the external connectors 406 of the interconnect structures 300 are fully intended to be included within the scope of the embodiments. In an embodiment the system package 600 may be placed into contact with the support substrate 135 and a reflow process may be performed to bond the system package 600 to the support substrate 135.

Figure 7A:
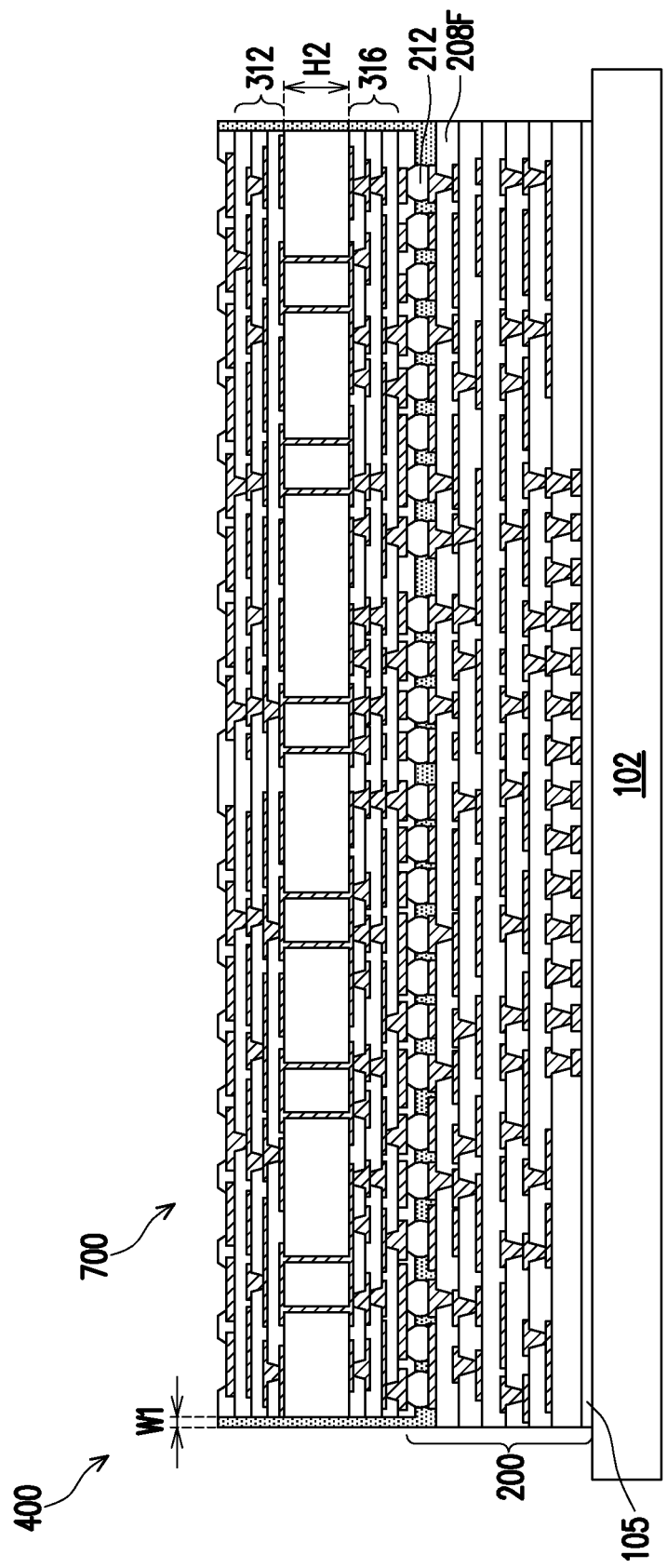
FIGS. 7A-7B illustrates a cross-sectional view of an intermediate step of performing an optional pre-cut in the package of FIG. 3, in accordance with some embodiments.

FIG. 7A illustrates, in accordance with some other embodiments, a cross-sectional view of mounting a single package interconnect substrate 700 to the redistribution structure 200 in an intermediate step in forming the package substrate 400. In an embodiment the single package interconnect substrate 700 is the only interconnect substrate bonded to the underlying redistribution structure 200, and there are no other interconnect structures (e.g., there are not multiple ones of the interconnect structures 300 as described in previous embodiments).

FIG. 7A additionally illustrates, according to some embodiments, the placing, mounting, and electrically connecting the single package interconnect substrate 700 to the redistribution structure 200. According to some embodiments, the single package interconnect substrate 700 may be formed on another carrier substrate (not shown) using any of the materials and the processes suitable for forming and mounting the interconnect structures 300, as set forth above. Once formed on the other carrier, the single package interconnect substrate 700 may be placed, mounted, and electrically connected to the redistribution structure 200 using, for example, the external connectors 212, as set forth above. However, any suitable materials and any suitable process for mounting the single package interconnect substrate 700 to the redistribution structure 200 may also be used.

FIG. 7A additionally illustrates an encapsulation of the single package interconnect substrate 700 with the underfill 402 once the single package interconnect substrate 700 has been bonded to the redistribution structure 200. In an embodiment the single package interconnect substrate 700 may be encapsulated as described above with respect to FIGS. 3A-3B. However, as there is no first gap 201 (see FIG. 3A-3B) within the single package interconnect substrate 700, the underfill 402 covers the sidewalls of the single package interconnect substrate 700 but does not interpose between different portions of the single package interconnect substrate 700.

Figure 7B:
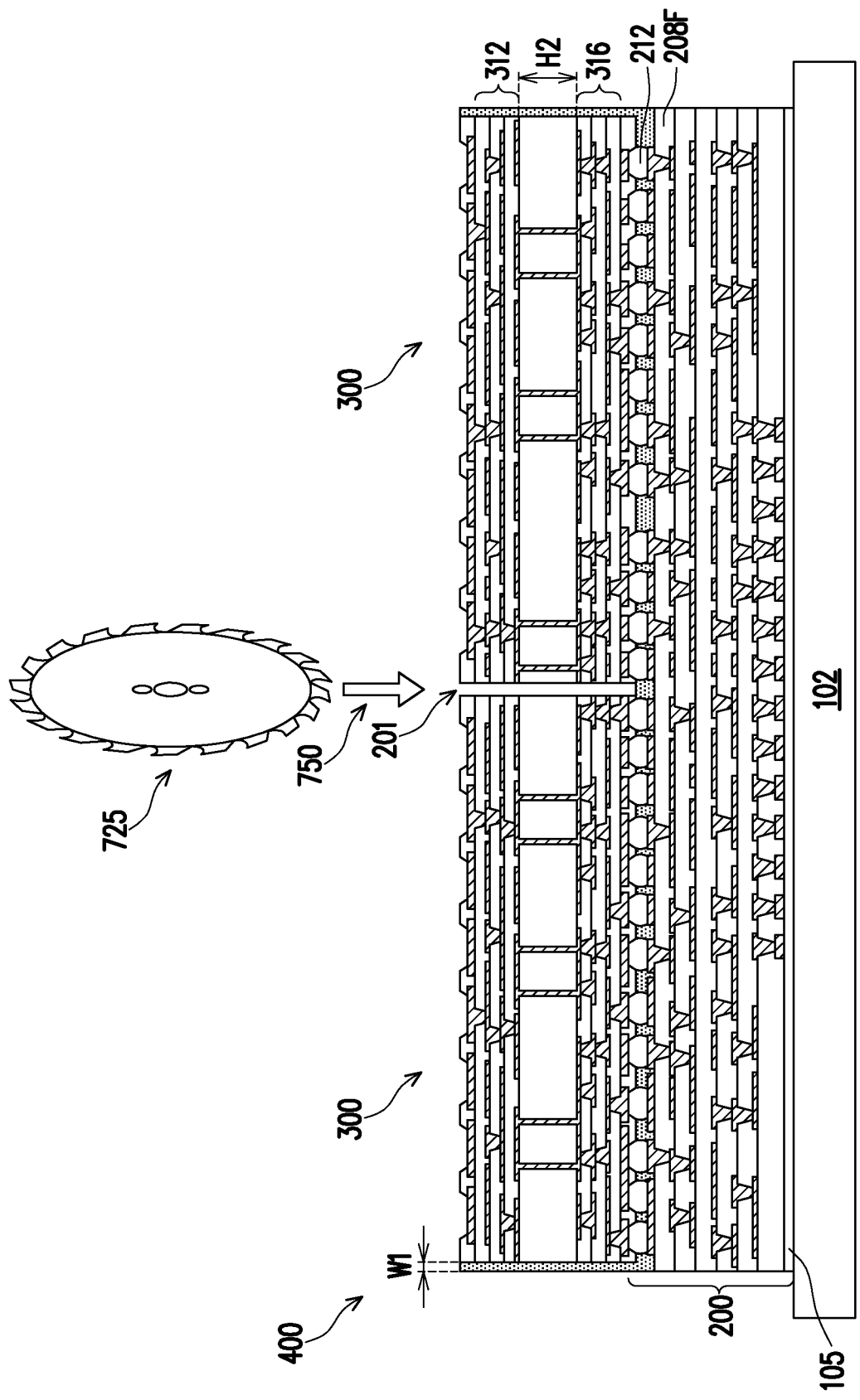

FIG. 7B illustrates a dicing process 750 (indicated by the directional arrow) in an intermediate step in forming the package substrate 400, in accordance with some other embodiments. Once the underfill 402 has been placed, the dicing process 750 (e.g., a "pre-cut" process, a singulation process, or the like) may be used to form the first gap 201 to separate the single package interconnect substrate 700 into a plurality of the interconnect structures 300, in accordance with some embodiments, without cutting into the redistribution structure 210. According to some embodiments, the single package interconnect substrate 700 may be separated into an array of the interconnect structures 300 (e.g., 2×2 array, 3×3 array, etc.). The dicing process 750 may be performed using any suitable dicing tool 725 (e.g., a blade, a saw, a laser drill, an etching process, and the like, or combinations thereof) to cut through and/or remove materials of the different layers of single package interconnect substrate 700 to form the first gap 201. However, any suitable techniques may be used to form the first gap 201 between the interconnect structures 300.

By placing the single package interconnect substrate 700 and then separating the single package interconnect substrate 700 into the individual interconnect structures 300, a single pick and place process may be performed to connect the single package interconnect substrate 700 to the redistribution structure 200 and the first gap 201 may still be formed. In this embodiment, however, the underfill 402 does not extend up into the first gap 201. Additionally, although not explicitly illustrated in FIG. 7B, in some embodiments the dicing process 750 will also extend the first gap 201 into the underfill 402.

Additionally, in other embodiments, once the gap 201 has been formed, a portion of the first gap 201 may be refilled with the underfill 402. For example, once the gap 201 has been formed, the underfill 402 may be dispensed, injected, or otherwise placed into a portion of the first gap 201. The dispensing may be performed so that the underfill 402 covers a portion of the sidewalls of the gap 201 as described above with respect to FIGS. 3A-3B.

In yet another embodiment, the order of the dicing process 750 and the placement of the underfill 402 may be switched, so that the single package interconnect substrate 700 is separated into the separate interconnect structures 300 first. Once separated, the underfill 402 may then be dispensed as described above with respect to FIGS. 3A-3B. Any suitable order of steps may be utilized to place the single package interconnect substrate 700, separate the single package interconnect substrate 700 into separate interconnect structures 300, and dispensing the underfill 402 may be utilized, and all such order of steps are fully intended to be included within the scope of the embodiments.

By utilizing multiple ones of the interconnect structures 300 separated by the first gap 201, stresses that are present in larger single interconnect structures are reduced or eliminated. As such, the multiple ones of the interconnect structures 300 with the first gap 201 allows for the reduction or elimination of warpage in the system package 600 (e.g., system on integrated substrate (SoIS)) and mitigates board level reliability challenges (e.g., ball-grid array (BGA) strain) associated with fabricating super-sized system packages. As such, the electrical performance and the board level reliability of the system package 600 may be improved.

By utilizing the embodiments described herein, the embodiments provide excellent electrical performance with reduced board level reliability risks even for super large package size (e.g., >90 mm$^2$ or >100 mm$^2$) designs used, for example, in HPC (high performance computing) applications (e.g., artificial intelligence (AI)) that require high data rate processing, increased bandwidth demands, and/or low latency communications. For example, the embodiments described herein provide reliable electrical performance for high data rate/high bandwidth applications and with reduced board level reliability risks. Also, a simplified process flow due to a conventional assembly process is integrated into a wafer form process.

According to embodiments described herein the package substrate 400 reduces package warpage in the system package 600 (e.g., system on integrated substrate (SoIS)) and mitigates board level reliability challenges (e.g., ball-grid array (BGA) strain) associated with fabricating super-sized system packages (e.g., "super PKG size") having dimensions greater than about 90 mm$^2$, or even greater than about 100 mm$^2$ while still providing a thin core thickness with low inductance and low resistance in a system package. Furthermore, reduced costs may be achieved using multiple discrete substrates for the interconnect structures 300 to form the package substrate 400 as compared with fabricating a full-sized interconnect substrate for super-sized system packages. As such, the system package 600 provides for low cost and highly reliable solutions for chip package integration (CPI) used in high-performance computing (HPC) applications including advanced networking and server products (e.g., artificial intelligence (AI)) that require high data rates processing, increased bandwidth demands, and/or low latency communication.

In accordance with an embodiment, a method includes: forming a redistribution structure on a carrier; attaching a first interconnect structure and a second interconnect structure on a first side of the redistribution structure, wherein after the attaching a first gap is disposed between a sidewall of the first interconnect structure and a sidewall of the second interconnect structure; and depositing a molded underfill material around the first interconnect structure, the molded underfill material having a first height within the first gap and having a second height on an opposite side of the first interconnect structure from the second interconnect structure, the second height being greater than the first height. In an embodiment, the redistribution structure is part of a system on integrated substrate with a package size of greater than 90 mm$^2$. In an embodiment the method further includes mounting a semiconductor device adjacent to a second side of the redistribution structure that is opposite the first side of the redistribution structure. In an embodiment, the attaching the first interconnect structure and the second interconnect structure includes: attaching the first interconnect structure; and separately attaching the second interconnect structure. In an embodiment, the attaching the first interconnect structure and the second interconnect structure includes: attaching a single package interconnect structure to the redistribution structure; and separating the single package interconnect structure into the first interconnect structure and the second interconnect structure after the attaching the single package interconnect structure. In an embodiment, the carrier is a wafer. In an embodiment, the carrier is a panel.

In accordance with another embodiment, a method includes: forming a polymer layer on a carrier substrate; forming a first contact pad on the polymer layer; forming a redistribution structure on the first contact pad; mounting an interconnect substrate to the redistribution structure; dispensing an underfill between the redistribution structure and the interconnect substrate; sawing the interconnect substrate after the mounting the interconnect substrate without sawing the redistribution structure; and electrically connecting a semiconductor device to the first contact pad, the semiconductor device being located on an opposite side of the first contact pad than the redistribution structure. In an embodiment the redistribution structure is part of a package, the package having a width of between about 30 mm and about 500 mm. In an embodiment the package is a system on integrated substrate package. In an embodiment the underfill covers a sidewall of the interconnect substrate. In an embodiment the method further includes attaching a ring to the redistribution structure. In an embodiment the semiconductor device is a packaged semiconductor device. In an embodiment the mounting the interconnect substrate further comprises forming the interconnect substrate, the forming the interconnect substrate includes: forming an opening through a core substrate; depositing a conductive material into the opening; forming a first routing layer on a first side of the core substrate; and forming a second routing layer on a second side of the core substrate, the second routing layer in electrical connection with the first routing layer through the conductive material.

In accordance with yet another embodiment, a semiconductor package includes: a redistribution structure; a first interconnect structure electrically connected to a first side of the redistribution structure; a second interconnect structure electrically connected to the first side of the redistribution structure, wherein the second interconnect structure is spaced apart from the first interconnect structure by a first region; a molded underfill material located at least partially within the first region, wherein the molded underfill material covers a first sidewall of the first interconnect structure within the first region less than the molded underfill material covers a second sidewall of the first interconnect structure outside of the first region; and a semiconductor device electrically connected to a second side of the redistribution structure opposite the first interconnect structure. In an embodiment the semiconductor package is a system on integrated substrate package. In an embodiment the molded underfill material has an interface with a protection layer of the first interconnect structure. In an embodiment the vertical sidewall interface has an interface with a routing layer of the first interconnect structure. In an embodiment the vertical sidewall interface has an interface with a core substrate of the first interconnect structure. In an embodiment the molded underfill material covers all of the second sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a redistribution structure;
   a first interconnect structure electrically connected to a first side of the redistribution structure;
   a second interconnect structure electrically connected to the first side of the redistribution structure, wherein the second interconnect structure is spaced apart from the first interconnect structure by a first region, wherein the second interconnect structure comprises a first sidewall facing the first interconnect structure;
   a molded underfill material located within the first region and a second region outside the first region, wherein the molded underfill material has a first height within the first region and a second height within the second region, wherein the first height is smaller than the second height, wherein the first sidewall of the second interconnect structure is only partially covered by the molded underfill material, wherein the molded underfill material within the first region is in physical contact with the first side of the redistribution structure, wherein the molded underfill material has a vertical sidewall within the second region, wherein the vertical sidewall has an interface with a protection layer of the first interconnect structure;
   a semiconductor device electrically connected to a second side of the redistribution structure opposite the first interconnect structure; and
   an external electrical connector disposed on a surface of the first interconnect structure facing away from the redistribution structure, wherein a first distance between a first end of the external electrical connector and the first side of the redistribution structure is smaller than the second height, and a second distance between a second end of the external electrical connector and the first side of the redistribution structure is greater than the second height, wherein the external electrical connector comprises contact bumps or solder balls.

2. The semiconductor package of claim 1, wherein the semiconductor package is a system on integrated substrate package.

3. The semiconductor package of claim 1, wherein the vertical sidewall has an interface with a routing layer of the first interconnect structure.

4. The semiconductor package of claim 3, wherein the vertical sidewall has an interface with a core substrate of the first interconnect structure, wherein the molded underfill material within the first region is not in physical contact with the routing layer of the first interconnect structure.

5. The semiconductor package of claim 1, wherein the second interconnect structure further comprises a second sidewall facing away from the first interconnect structure, wherein the molded underfill material covers all of the second sidewall.

6. The semiconductor package of claim 1, wherein the first interconnect structure further comprises a core substrate and a dielectric layer on a surface of the core substrate facing away from the redistribution structure, wherein a sidewall of the dielectric layer is aligned with a sidewall of the core substrate.

7. A semiconductor package comprising:
   a redistribution structure;
   a first interconnect structure electrically connected to a first side of the redistribution structure, wherein the first interconnect structure further comprises a core substrate and a protection layer, and the protection layer is on a side of the core substrate facing away from the redistribution structure;
   first conductive connectors disposed on a side of the first interconnect structure facing away from the redistribution structure;
   a second interconnect structure electrically connected to the first side of the redistribution structure, wherein the second interconnect structure is spaced apart from the first interconnect structure;
   second conductive connectors disposed on a side of the second interconnect structure facing away from the redistribution structure; and
   a molded underfill material located at least partially between the first interconnect structure and the second interconnect structure, wherein the molded underfill material partially covers a first sidewall of the first interconnect structure adjacent the second interconnect structure and completely covers a second sidewall of the first interconnect structure facing away from the second interconnect structure, wherein the protection layer has a third sidewall in contact with the molded underfill material and a fourth sidewall spaced apart from the molded underfill material.

8. The semiconductor package of claim 7, further comprising a semiconductor device electrically connected to a second side of the redistribution structure opposite the first interconnect structure.

9. The semiconductor package of claim 7, further comprising a ring structure disposed over a second side of the redistribution structure opposite the first interconnect structure.

10. The semiconductor package of claim 7, further comprising a support substrate attached to the first conductive connectors and the second conductive connectors.

11. The semiconductor package of claim 10, wherein the support substrate has a width greater than a width of the redistribution structure.

12. The semiconductor package of claim 7, wherein the first interconnect structure comprises a routing layer, wherein the routing layer has a third sidewall in contact with the molded underfill material and a fourth sidewall spaced apart from the molded underfill material.

13. A semiconductor package comprising:
   a redistribution structure;
   a first interconnect structure in electrical connection to a first side of the redistribution structure, wherein the first interconnect structure comprises a first core substrate and a first routing structure on a side of the first core substrate facing away from the redistribution structure;

a second interconnect structure in electrical connection to the first side of the redistribution structure, wherein the second interconnect structure comprises a second core substrate and a second routing structure on a side of the second core substrate facing away from the redistribution structure, wherein the second interconnect structure is spaced apart from the first interconnect structure, wherein the first routing structure of the first interconnect structure has a first sidewall adjacent to the second interconnect structure and a second sidewall facing away from the second interconnect structure, wherein the first core substrate has a third sidewall aligned with the first sidewall of the first routing structure and a fourth sidewall aligned with the second sidewall of the first routing structure; and a molded underfill material around the first interconnect structure and over the redistribution structure, wherein the molded underfill material covers the second sidewall of the first routing structure without covering the first sidewall of the first routing structure.

14. The semiconductor package of claim 13, further comprising a semiconductor device electrically connected to a second side of the redistribution structure opposite the first interconnect structure.

15. The semiconductor package of claim 13, further comprising a ring structure disposed over a second side of the redistribution structure opposite the first interconnect structure.

16. The semiconductor package of claim 13, further comprising a semiconductor device and a ring structure disposed over a second side of the redistribution structure opposite the first interconnect structure, wherein the semiconductor device is laterally surrounded by the ring structure.

17. The semiconductor package of claim 13, wherein the third sidewall of the first core substrate is partially covered by the molded underfill material.

18. The semiconductor package of claim 16, wherein a sidewall of the second core substrate is partially covered by the molded underfill material.

19. The semiconductor package of claim 13, wherein the first routing structure further comprises a dielectric layer and a routing layer in the dielectric layer, wherein the dielectric layer comprises at least one sidewall covered by the molded underfill material and at least one sidewall not covered by the molded underfill material.

* * * * *